(12) United States Patent
Cho et al.

(10) Patent No.: US 9,978,694 B2
(45) Date of Patent: May 22, 2018

(54) SEMICONDUCTOR PACKAGE AND METHOD OF FABRICATING THE SAME

(71) Applicant: SAMSUNG ELECTRONICS CO., LTD., Suwon-si, Gyeonggi-do (KR)

(72) Inventors: Kyongsoon Cho, Incheon (KR); Myoungkyun Kil, Seoul (KR); Hansung Ryu, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days. days.

(21) Appl. No.: 15/495,051

(22) Filed: Apr. 24, 2017

(65) Prior Publication Data

US 2018/0068958 A1 Mar. 8, 2018

(30) Foreign Application Priority Data

Sep. 5, 2016 (KR) ........................ 10-2016-0114018

(51) Int. Cl.
| | | |
|---|---|---|
| *H01L 23/02* | (2006.01) | |
| *H01L 23/22* | (2006.01) | |
| *H01L 23/00* | (2006.01) | |
| *H01L 25/065* | (2006.01) | |
| *H01L 23/48* | (2006.01) | |
| *H01L 25/00* | (2006.01) | |

(52) U.S. Cl.
CPC .......... *H01L 23/562* (2013.01); *H01L 23/481* (2013.01); *H01L 25/0657* (2013.01); *H01L 25/50* (2013.01); *H01L 2225/06513* (2013.01); *H01L 2225/06541* (2013.01); *H01L 2225/06555* (2013.01); *H01L 2225/06582* (2013.01)

(58) Field of Classification Search
CPC ................. H01L 25/50; H01L 25/0657; H01L 2225/06582; H01L 2225/06555; H01L 2225/06541; H01L 2225/06513; H01L 23/562; H01L 23/481
USPC .................. 257/686, 687, 698; 438/107–112
See application file for complete search history.

(56) References Cited

U.S. PATENT DOCUMENTS

| | | | |
|---|---|---|---|
| 8,193,604 B2 | 6/2012 | Lin et al. | |
| 8,617,924 B2 | 12/2013 | Kim et al. | |
| 8,623,763 B2 | 1/2014 | West | |
| 8,653,676 B2 | 2/2014 | Kim et al. | |
| 8,759,154 B2 | 6/2014 | Simmons-Matthews | |
| 8,945,985 B2 | 2/2015 | Kim et al. | |
| 9,029,199 B2 * | 5/2015 | Sakurada | H01L 21/78 257/686 |
| 9,190,391 B2 | 11/2015 | Kelkar et al. | |

(Continued)

FOREIGN PATENT DOCUMENTS

KR 1020110080551 7/2011

*Primary Examiner* — Hsien Ming Lee
(74) *Attorney, Agent, or Firm* — F. Chau & Associates, LLC

(57) ABSTRACT

Disclosed are a semiconductor package and a method of fabricating the same. The semiconductor package includes a first substrate, and a first semiconductor chip positioned above the first substrate. A second semiconductor chip is positioned above a top surface of the first semiconductor chip. An adhesive layer is between the first semiconductor chip and the second semiconductor chip. A second substrate is disposed on the second semiconductor chip. The second substrate substantially covers a top surface of the second semiconductor chip. A mold layer is disposed between the first substrate and the second substrate.

17 Claims, 9 Drawing Sheets

(56) References Cited

U.S. PATENT DOCUMENTS

2014/0091454 A1  4/2014  Lin et al.
2015/0221573 A1  8/2015  Paek et al.
2015/0221586 A1  8/2015  Paek et al.

* cited by examiner

SEMICONDUCTOR PACKAGE AND METHOD OF FABRICATING THE SAME

CROSS-REFERENCE TO RELATED APPLICATION

This U.S. nonprovisional patent application claims priority under 35 U.S.C § 119 to Korean Patent Application 10-2016-0114018, filed on Sep. 5, 2016, the disclosure of which is incorporated by reference herein in its entirety.

TECHNICAL FIELD

Exemplary embodiments of the present inventive concept relate to a semiconductor package, and more particularly to a method of fabricating the same.

DISCUSSION OF RELATED ART

Semiconductor devices may be relatively light weight, relatively compact in size, relatively high speed and relatively high performance devices. A semiconductor package may include an integrated circuit chip usable in electronic products. A through electrode (e.g., a TSV) may be included in a semiconductor package.

SUMMARY

One or more exemplary embodiments of the present inventive concept provide a semiconductor package having reduced warpage characteristics.

According to an exemplary embodiment of the present inventive concept, a semiconductor package includes a first substrate, and a first semiconductor chip positioned above the first substrate. A second semiconductor chip is positioned above a top surface of the first semiconductor chip. An adhesive layer is between the first semiconductor chip and the second semiconductor chip. A second substrate is disposed on the second semiconductor chip. The second substrate substantially covers a top surface of the second semiconductor chip. A mold layer is disposed between the first substrate and the second substrate.

According to an exemplary embodiment of the present inventive concept, a method of fabricating a semiconductor package includes mounting chip stacks on a top surface of a first substrate. Each of the chip stacks includes a plurality of stacked semiconductor chips and an adhesive layer between the semiconductor chips. A mold layer is formed on the top surface of the first substrate. A portion of the mold layer and portions of topmost chips of each of the chip stacks are removed. A second substrate is formed on the topmost chip of each of the chip stacks and the mold layer.

BRIEF DESCRIPTION OF THE DRAWINGS

The above and other features of the inventive concept will become more apparent by describing in detail exemplary embodiments thereof, with reference to the accompanying drawings, in which.

DETAILED DESCRIPTION

Figure 1:
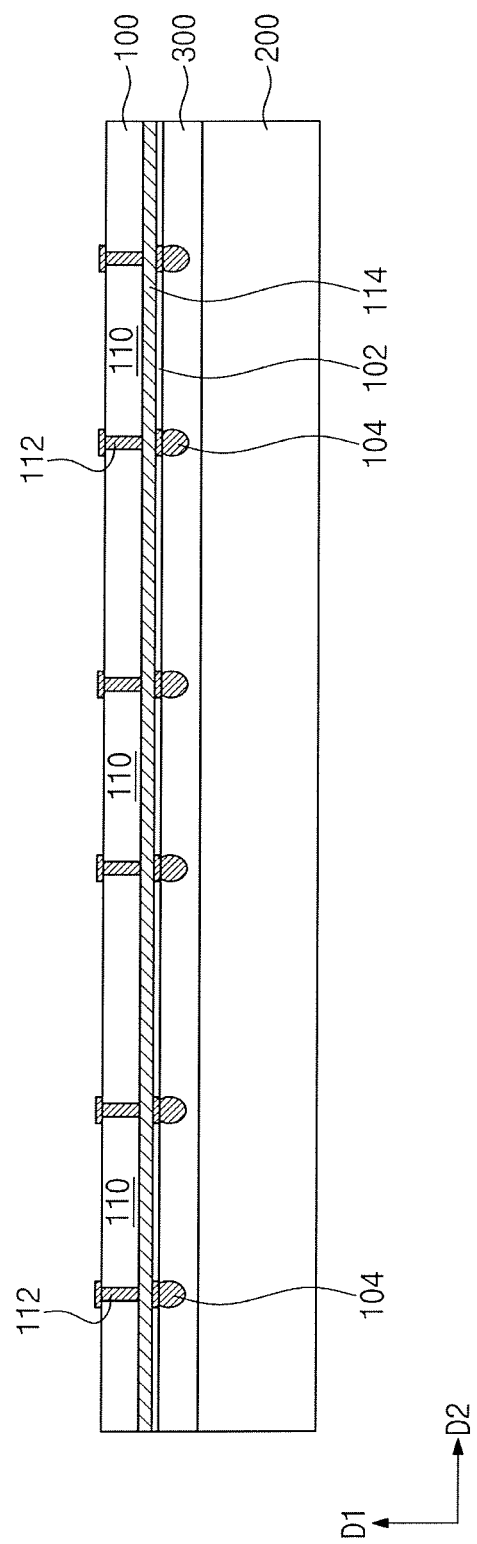
FIGS. 1 to 7 are cross-sectional views illustrating a method of fabricating a semiconductor package according to an exemplary embodiment of the present inventive concept.

Exemplary embodiments of the present inventive concept will be described below in more detail with reference to the accompanying drawings. In this regard, the present inventive concept may have different forms and should not be construed as being limited to the exemplary embodiments of the present inventive concept described herein.

Like reference numerals may refer to like elements throughout the specification and drawings.

A first direction D1 may refer to a direction perpendicular to a top surface of a first substrate 100 (see, e.g., FIGS. 1-7), and a second direction D2 may refer to a direction parallel to the top surface of the first substrate 100 (see, e.g., FIGS. 1-7).

FIGS. 1 to 7 are cross-sectional views illustrating a method of fabricating a semiconductor package according to an exemplary embodiment of the present inventive concept.

Referring to FIG. 1, a first substrate 100 may be formed on a carrier substrate 200. As an example, a carrier adhesive layer 300 may attach the first substrate 100 to the carrier substrate 200.

The first substrate 100 may include a base semiconductor chip 110. For example, the first substrate 100 may be a wafer-level semiconductor substrate including of a semiconductor material such as silicon. The base semiconductor chip 110 may include a base circuit layer 114 and a base through electrode 112. The base circuit layer 114 may be positioned on a bottom surface of the base semiconductor chip 110. For example, an upper surface of the base circuit layer 114 may be in direct contact with a bottom surface of the base semiconductor chip 110. The base circuit layer 114 may include a integrated circuit. For example, the base circuit layer 114 may include a memory circuit, a logic circuit, or a combination thereof. The base through electrode 112 may penetrate the base semiconductor chip 110 in the first direction D1. The base through electrode 112 may be electrically connected to the base circuit layer 114. The bottom surface of the base semiconductor chip 110 may be an active surface. The first substrate 100 may include the base semiconductor chip 110 (e.g., a plurality of the base semiconductor chips 110 may be included in the first substrate 100), however exemplary embodiments of the present inventive concept are not limited thereto. In an exemplary embodiment of the present inventive concept, the first substrate 100 need not include the base semiconductor chip 110.

The first substrate 100 may include a protection layer 102 and an external interconnect terminal 104. The protection layer 102 may be positioned below the first substrate 100. The protection layer 102 may substantially cover the base circuit layer 114. For example, an upper surface of the protection layer 102 may be in direct contact with a bottom surface of the base circuit layer 114. The protection layer 102 may include a silicon nitride (SiN) layer. A plurality of external interconnect terminals 104 may be positioned on the bottom surface of the base semiconductor chip 110. The external interconnect terminals 104 may each be electrically connected to the base circuit layer 114. The protection layer 102 may be exposed through the external interconnect terminals 104.

Figure 2:
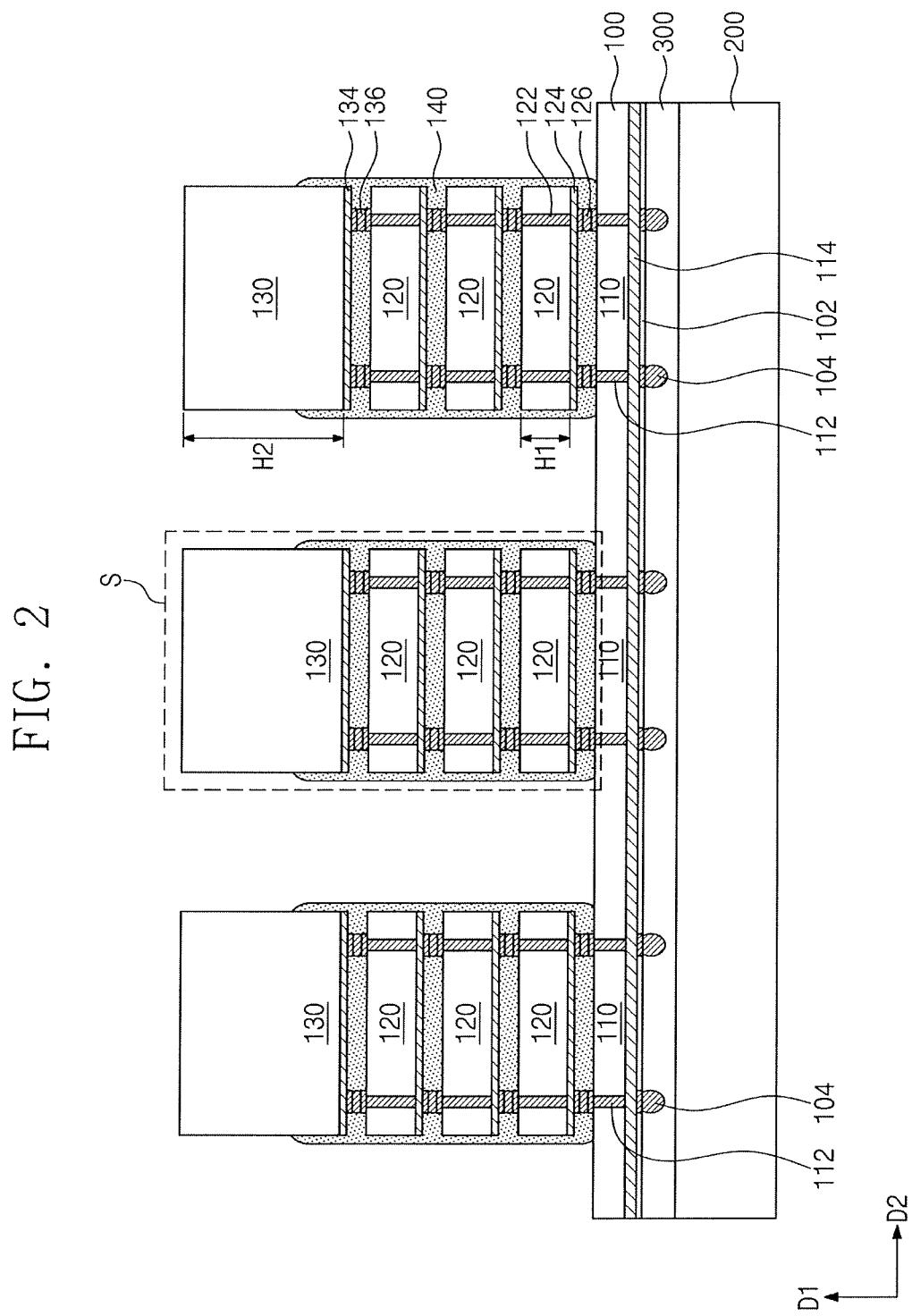

Referring to FIG. 2, chip stacks S may be positioned on the first substrate 100. The chip stacks S may be positioned above the base semiconductor chip 110 of the first substrate 100. The chip stacks S may be spaced apart from each other in the second direction D2. Each of the chip stacks S may include a plurality of semiconductor chips 120 and 130 that are stacked in the first direction D1. As an example, each of the chip stacks S may include a first semiconductor chip 120 and a second semiconductor chip 130.

The first semiconductor chip 120 may be positioned on the base semiconductor chip 110 of the first substrate 100.

The first semiconductor chip 120 and the base semiconductor chip 110 of the first substrate 100 may have a chip-on-wafer (COW) structure. The first semiconductor chip 120 may include a first circuit layer 124 and a first through electrode 122. The first circuit layer 124 may include a memory circuit. The first through electrode 122 may penetrate the first semiconductor chip 110 in the first direction D1. The first through electrode 122 may be electrically connected to the first circuit layer 124. A bottom surface of the first semiconductor chip 120 may be an active surface. A plurality of first bumps 126 may be positioned on the bottom surface of the first semiconductor chip 120. The first bumps 126 may be positioned between the base semiconductor chip 110 and the first semiconductor chip 120, which may be electrically connected to each other by the first bumps 126. The first semiconductor chip 120 may include a plurality of first semiconductor chips 120 or a single first semiconductor chip 120, which may be positioned on the base semiconductor chip 110. For example, a plurality of the first semiconductor chips 120 may be stacked on the base semiconductor chip 110. In this configuration, the first bumps 126 may be further formed between adjacent first semiconductor chips 120.

The second semiconductor chip 130 may be positioned on the first semiconductor chip 120. The second semiconductor chip 130 may be a topmost chip in the chip stack S. As an example, the second semiconductor chip 130 may be positioned at a topmost level of the chip stack S including the semiconductor chips 120 and 130. A bottom surface of the second semiconductor chip 130 may be an active surface. The second semiconductor chip 130 may include a second circuit layer 134. The second circuit layer 134 may include a memory circuit. A plurality of second bumps 136 may be positioned on the bottom surface of the second semiconductor chip 130. The second bumps 136 may be positioned between the first semiconductor chip 120 and the second semiconductor chip 130, which may be electrically connected to each other by the second bumps 136. The second semiconductor chip 130 may have a second thickness H2 greater than a first thickness H1 of the first semiconductor chip 120.

An adhesive layer 140 may be formed between the semiconductor chips 110, 120 and 130. The adhesive layer 140 may include a non-conductive film (NCF). For example, the adhesive layer 140 may be a polymer tape including an insulative material. The adhesive layer 140 may be formed between the bumps 126 and 136, and thus an occurrence of an electrical short between the bumps 126 and 136 may be reduced or eliminated. For example, a solder ball and an adhesive material may be adhered to the bottom surface of the first semiconductor chip 120, and the first semiconductor chip 120 may be positioned such that its bottom surface faces the top surface of the first substrate 100. In this configuration, the adhesive material may overflow toward a side of the first semiconductor chip 120. As an example, the adhesive material may flow to outside the first semiconductor chip 120. The adhesive layer 140 may thus have a width greater than those of the semiconductor chips 120 and 130. The second semiconductor chip 130 may also be mounted in substantially the same manner as discussed above with regard to the first semiconductor chip 120. In an exemplary embodiment of the present inventive concept, the adhesive layer 140 may substantially cover side surfaces of the semiconductor chips 120 and 130. Alternatively, an underfill layer may be formed between the semiconductor chips 110, 120 and 130 in substantially a same manner as the adhesive layer 140 described above.

Figure 3:
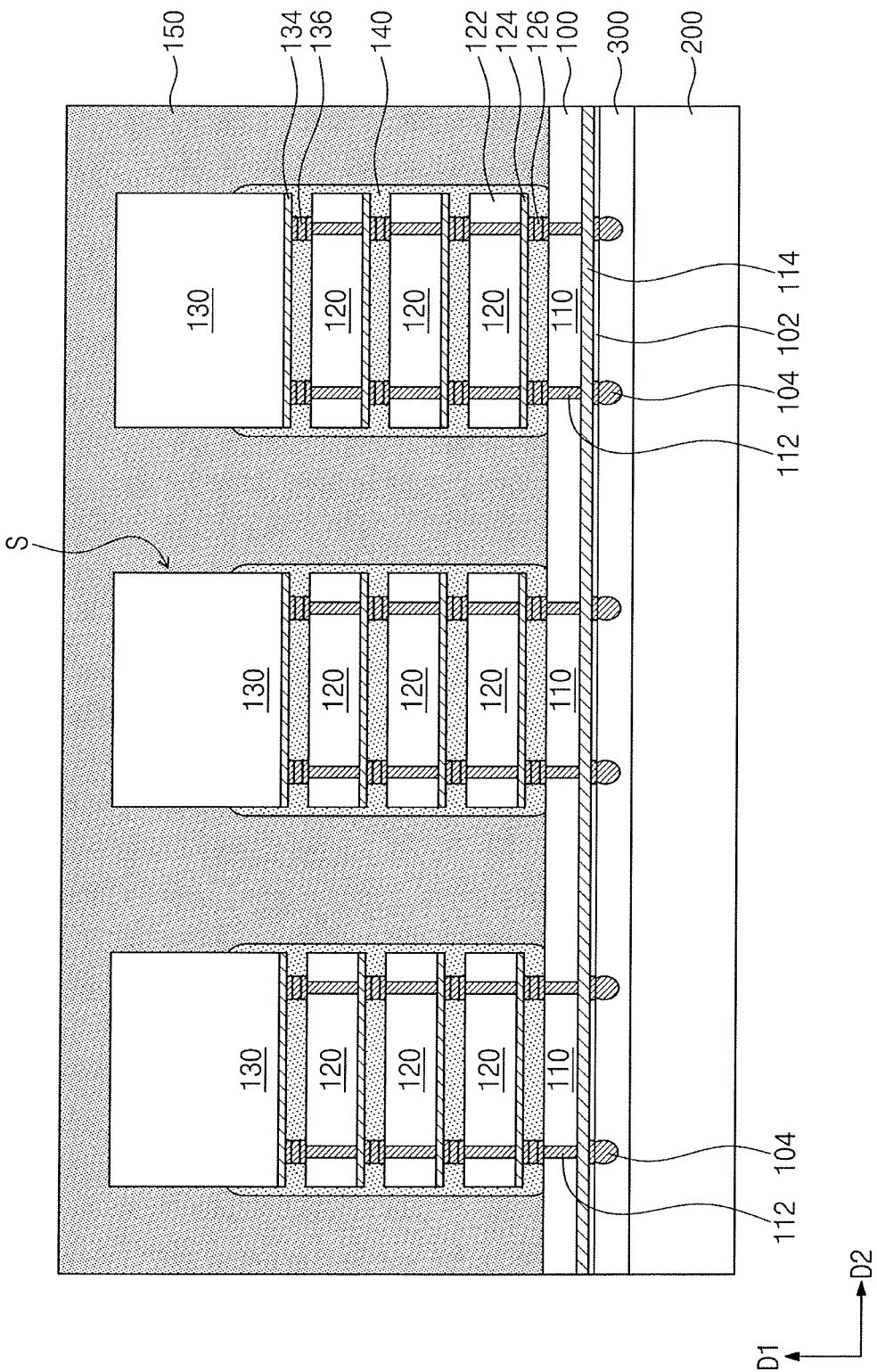

Referring to FIG. 3, a mold layer 150 may be formed on the top surface of the first substrate 100. The mold layer 150 may substantially cover the chip stack S. The mold layer 150 may have a top surface higher than a top surface of the second semiconductor chip 130. As viewed in a plan view, the mold layer 150 may substantially surround the chip stack S. The mold layer 150 may include an insulative polymer material. For example, the mold layer 150 may include an epoxy molding compound (EMC).

Figure 4:
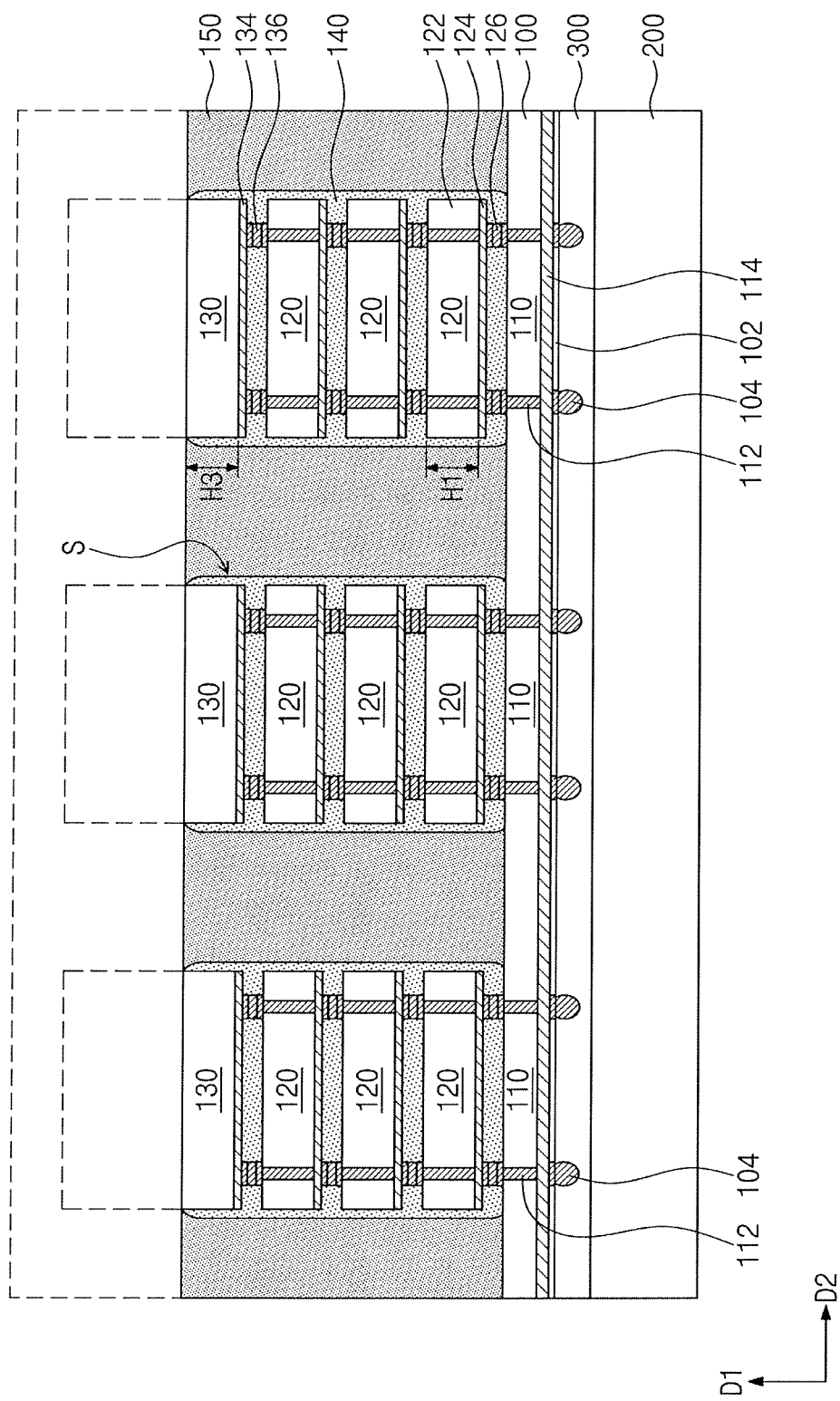

Referring to FIG. 4, portions of the mold layer 150 and the second semiconductor chip 130 may be removed. As an example, a grinding process may be performed on the top surface of the mold layer 150. As designated by a dotted line, an upper portion of the mold layer 150 may be partially removed. An upper surface of the mold layer 150 may be substantially aligned with an upper surface of the second semiconductor chip 130 along the second direction D2 after the mold layer 150 is partially removed. An upper portion of the second semiconductor chip 130 may also be ground substantially simultaneously with the upper portion of the mold layer 150. Thus, the second semiconductor chip 130 may be adjusted in thickness from the second thickness H2 to a third thickness H3. The third thickness H3 may be less than the second thickness H2. The ground third thickness H3 of the second semiconductor chip 130 may be substantially identical to the first thickness H1 of the first semiconductor chip 120. As used herein, the term of "identical" may refer to an error of about 0% to about 10% (e.g., an error measurement of a thickness difference between the third thickness H3 and the first thickness H1).

If the second semiconductor chip 130 is thicker than the first semiconductor chips 120, the adhesive layer 140 may be positioned relatively closer to the first substrate 100. The adhesive layer 140 may have a coefficient of thermal expansion (CTE) different from that of the mold layer 150. When a semiconductor package experiences variation in temperature, different expansion lengths along the second direction D2 may be provided between a lower portion (e.g., adjacent to the first substrate 100) and an upper portion (e.g., adjacent to the second semiconductor chip 130) of the semiconductor package. This may induce the semiconductor package to suffer from warpage caused by the temperature variation.

According to an exemplary embodiment of the present inventive concept, the first semiconductor chips 120 stacked on the first substrate 100 and the second semiconductor chip 130 corresponding to the topmost chip may have substantially a same thickness as each other (e.g., in the first direction D1). As an example, the second semiconductor chip 130 may have substantially the same thickness as the first semiconductor chip 120 after removing an upper portion of the second semiconductor chip 130 (e.g., by grinding). As an example, a semiconductor package according to an exemplary embodiment of the present inventive concept may include substantially an equal amount of the adhesive layer 140 in both upper and lower portions thereof. Thus, a semiconductor package according to an exemplary embodiment of the present inventive concept may have substantially identical or similar thermal expansion coefficient in its upper and lower portions, and thus an occurrence of warpage caused by the temperature variation may be reduced or eliminated.

Figure 5:
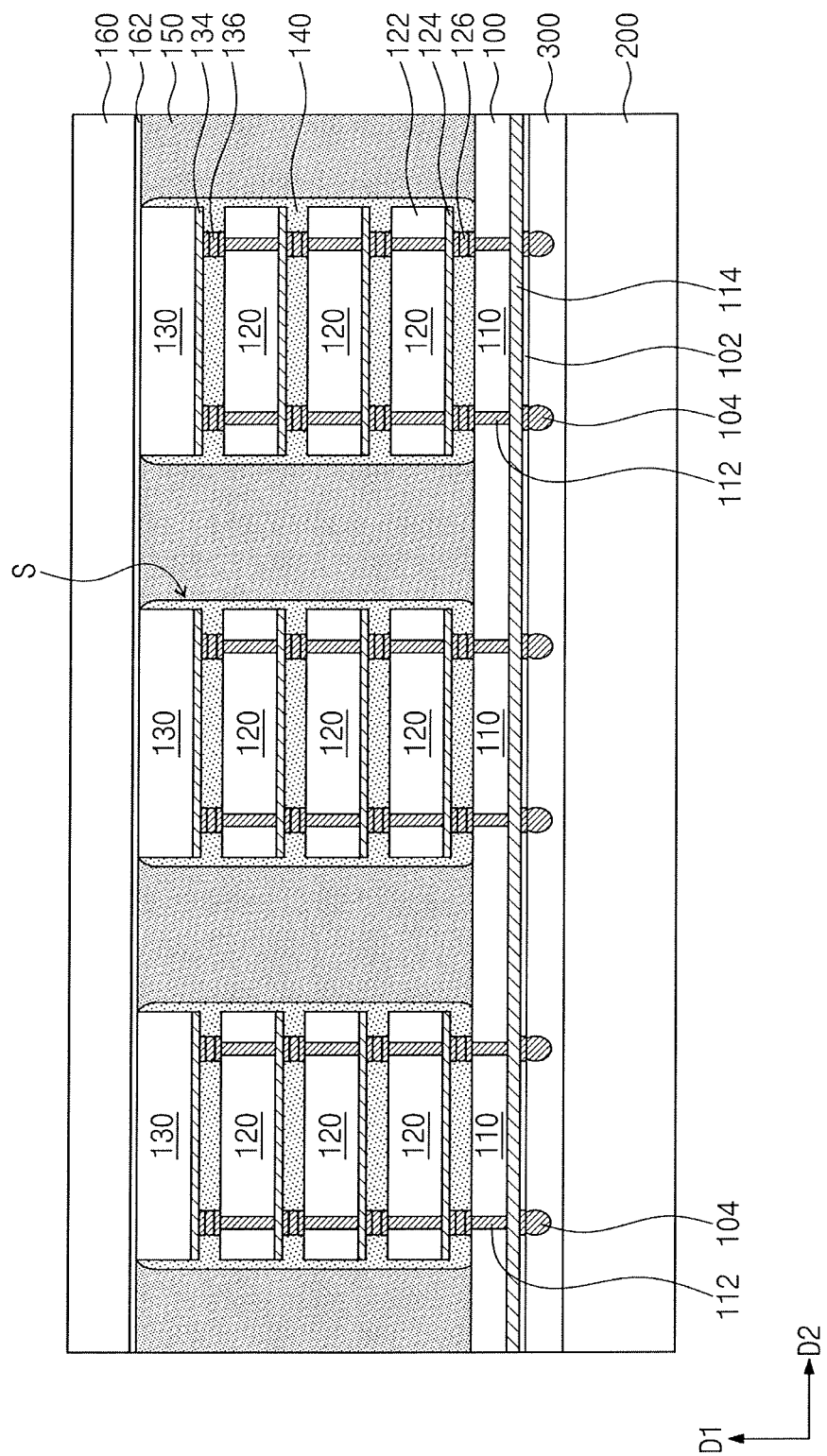

Referring to FIG. 5, a second substrate 160 may be formed on the second semiconductor chip 130. As an example, an adhesive member 162 may be formed between the second substrate 160 on the second semiconductor chip 130. The second substrate 160 may be attached to the top surfaces of the second semiconductor chip 130 and the mold layer 150. The second substrate 160 may include a same material as the first substrate 100. For example, the second substrate 160 may be a silicon (Si) wafer.

In an exemplary embodiment of the present inventive concept, the second substrate 160 may cover substantially an entire top surface of the semiconductor package. The second substrate 160 may be relatively stiffer and more resistant to mechanical breakage than the adhesive layer 140 and the mold layer 150. Thus, when the semiconductor package experiences a bending force, the second substrate 160 may firmly support the semiconductor package, and may reduce or eliminate an occurrence of warpage in the semiconductor package.

Figure 6:
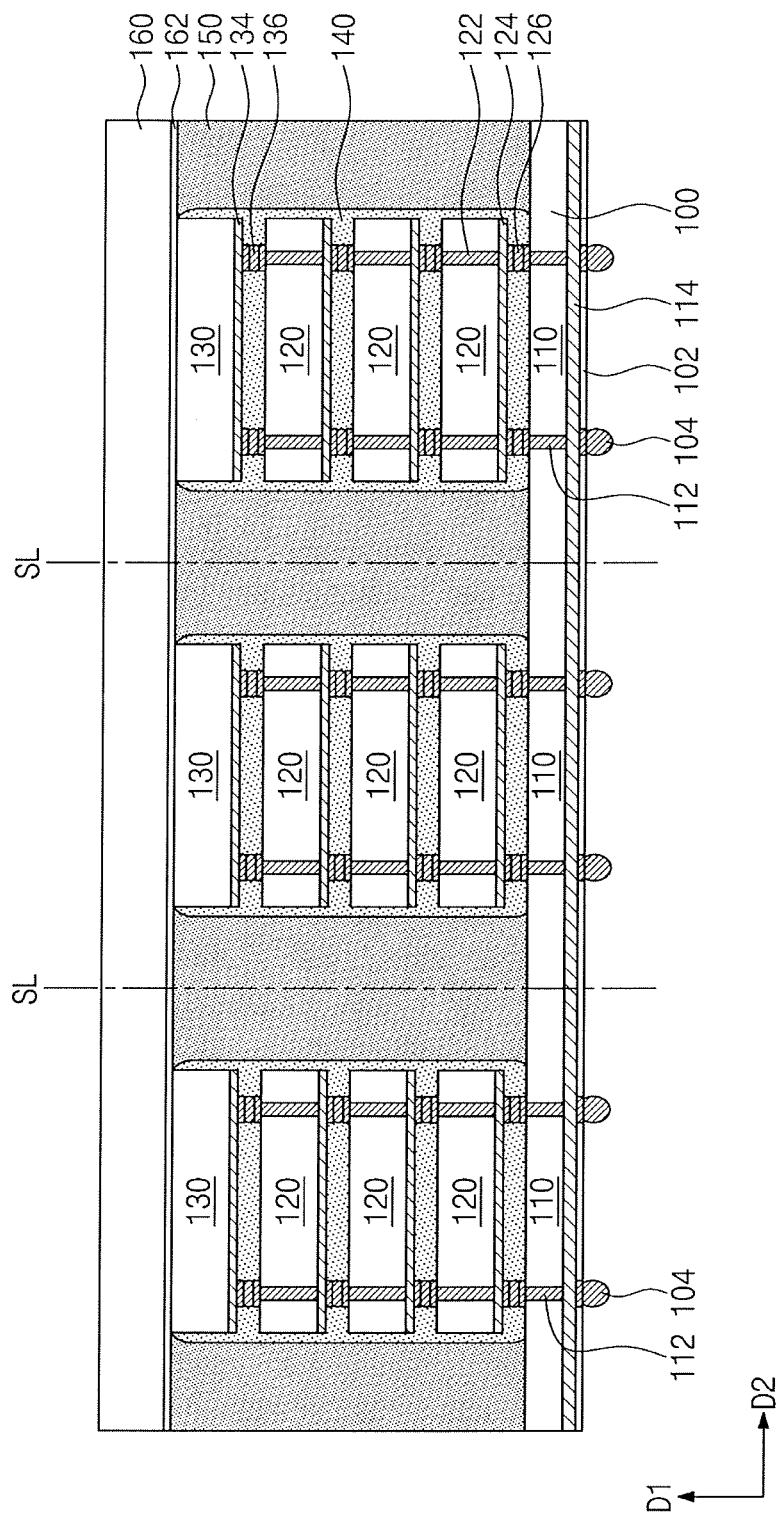

Referring to FIG. 6, the carrier substrate 200 and the carrier adhesive layer 300 may be removed. As an example, the carrier substrate 200 and the carrier adhesive layer 300 may be removed to expose the external interconnect terminals 104 and the protection layer 102 of the first substrate 100.

Figure 7:
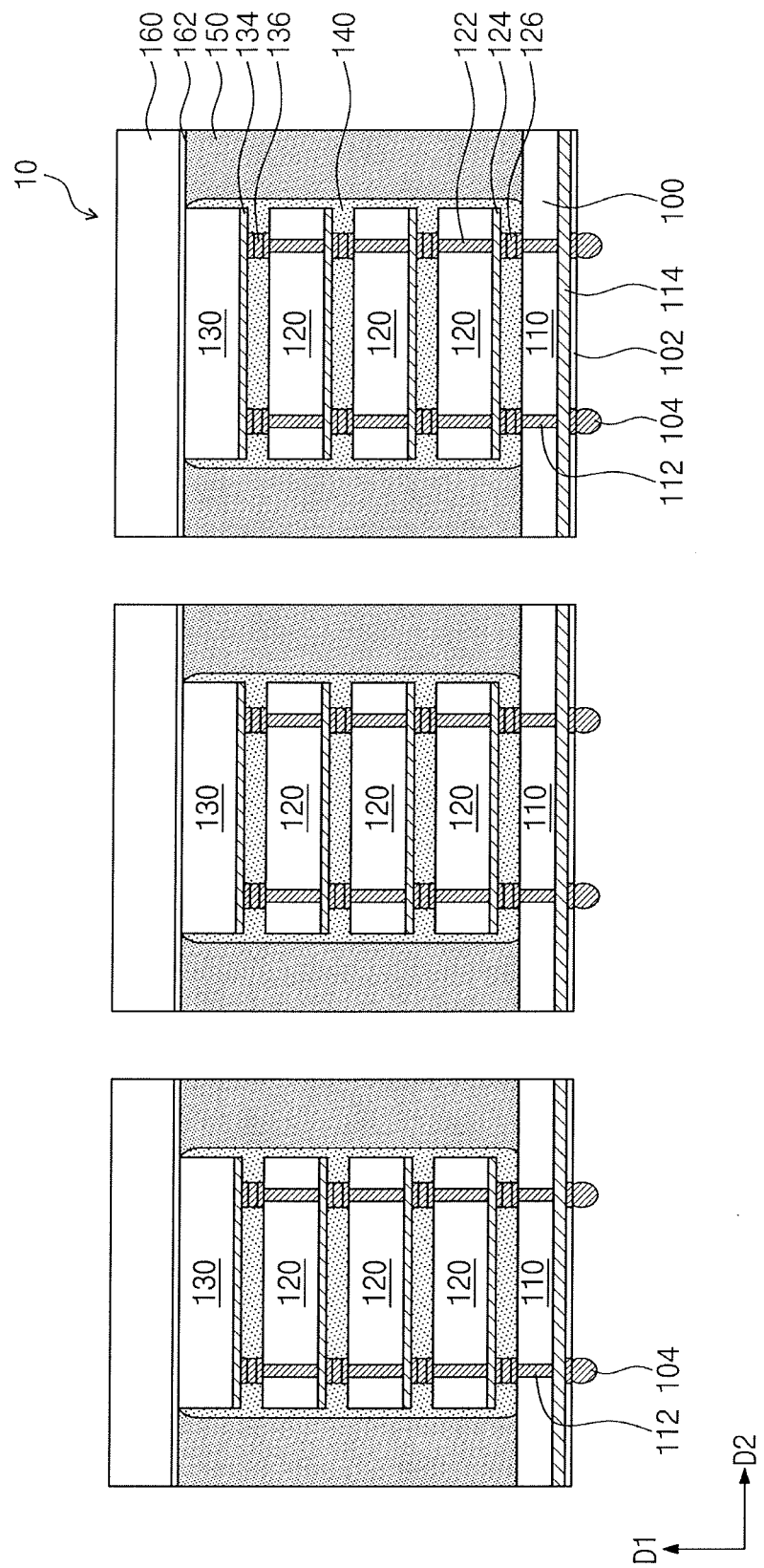

Referring to FIG. 7, the first substrate 100 may undergo a sawing process. The sawing process may be performed along a scribe lane SL (see, e.g., FIG. 6). For example, the scribe lane SL may extend along the first direction D1 in the mold layer 150 between the chip stacks S. Thus, a plurality of package units 10 may be formed.

Figure 8:
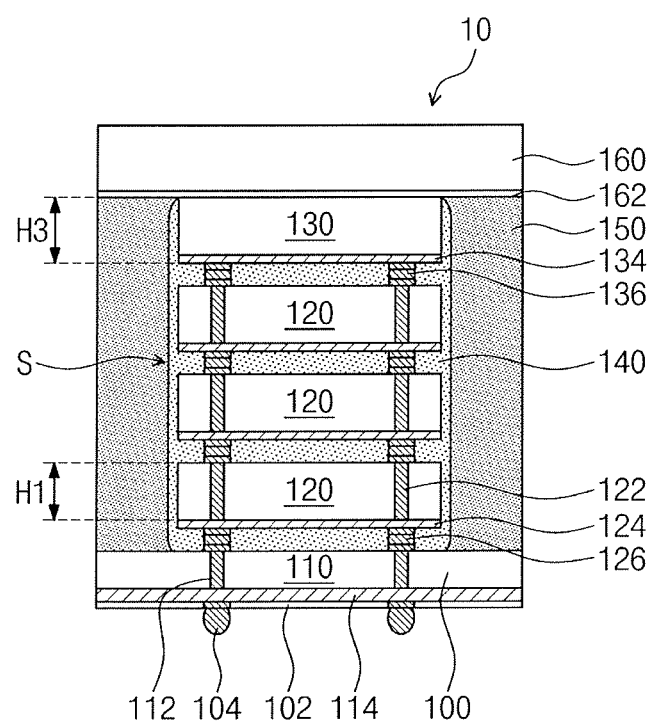
FIGS. 8 and 9 are cross-sectional views illustrating a package unit according to an exemplary embodiment of the present inventive concept.
Figure 9:
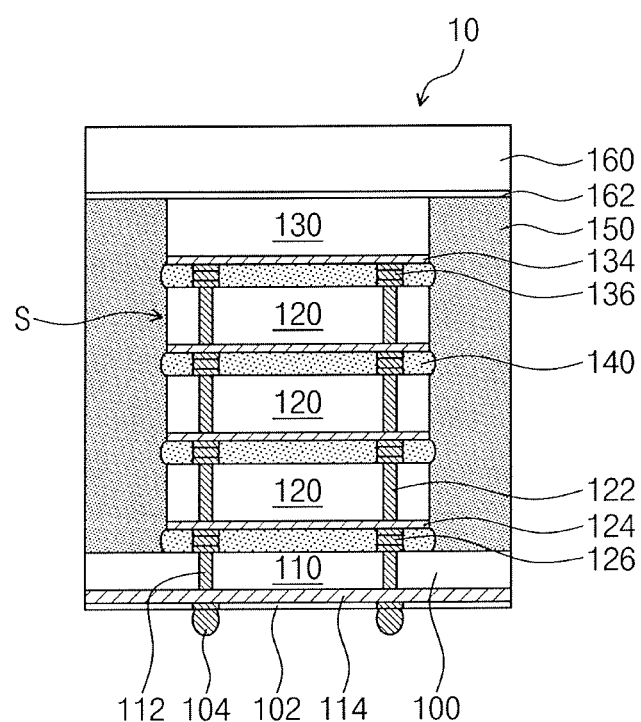

FIGS. 8 and 9 are cross-sectional views illustrating a package unit according to an exemplary embodiment of the present inventive concept. Components described with reference to FIGS. 8 and 9 having the same reference numerals as those described above with reference to FIGS. 1-7 may be substantially the same as each other, and thus duplicative descriptions may be omitted.

Referring to FIG. 8, the first substrate 100 may be provided. The first substrate 100 may include the base semiconductor chip 110. The base semiconductor chip 110 may include the base circuit layer 114 and the base through electrode 112. In an exemplary embodiment of the present inventive concept, the first substrate 100 need not include the base semiconductor chip 110. The first substrate 100 may include on its bottom surface the protection layer 102 and external interconnect terminals 104. The protection layer 102 may substantially cover the base circuit layer 114. The external interconnect terminals 104 may be electrically connected to the base circuit layer 114.

The chip stack S may be mounted on the first substrate 100. The chip stack S may be mounted on the base semiconductor chip 110 of the first substrate 100. The chip stack S may include stacked first and second semiconductor chips 120 and 130.

The first semiconductor chip 120 may be mounted on the base semiconductor chip 110. The first semiconductor chip 120 may include the first circuit layer 124 and the first through electrode 122. A plurality of first bumps 126 may electrically connect the first semiconductor chip 120 to the base semiconductor chip 110. The first semiconductor chip 120 may include a plurality of first semiconductor chips 120, which are stacked on the base semiconductor chip 110.

The second semiconductor chip 130 may be mounted on the first semiconductor chip 120. The second semiconductor chip 130 may be a topmost chip. The second semiconductor chip 130 may include a second circuit layer 134. A plurality of second bumps 136 may electrically connect the second semiconductor chip 130 to the first semiconductor chip 120. The second semiconductor chip 130 may have a third thickness H3, which is substantially the same as the first thickness H1 of the first semiconductor chip 120.

The adhesive layer 140 may be between the semiconductor chips 110, 120 and 130. The adhesive layer 140 may be between the bumps 126 and 136, and thus an electrical short between the bumps 126 and 136 may be reduced or eliminated. The adhesive layer 140 may have a width greater than those of the semiconductor chips 120 and 130. The adhesive layer 140 may substantially cover side surfaces of the semiconductor chips 120 and 130. Alternatively, referring to FIG. 9, the adhesive layer 140 need not cover the side surfaces of the semiconductor chips 120 and 130.

The mold layer 150 may be disposed on a top surface of the first substrate 100. As an example, the mold layer 150 may substantially cover the top surface of the first substrate 100 and may substantially surround the chip stack S. The mold layer 150 may have a top surface that is substantially coplanar with a top surface of the second semiconductor chip 130 along the second direction. The mold layer 150 may include an epoxy molding compound (EMC).

The second substrate 160 may be disposed on the second semiconductor chip 130. The second substrate 160 may substantially cover the top surfaces of the second semiconductor chip 130 and the mold layer 150. The second substrate 160 may be a silicon wafer. The adhesive member 162 may be disposed between the second substrate 160 and each of the second semiconductor chip 130 and the mold layer 150.

According to an exemplary embodiment of the present inventive concept, the same thickness may be given to the first semiconductor chip stacked on the first substrate and the second semiconductor chip corresponding to the topmost chip. As an example, a semiconductor package may include therein the adhesive layer in an amount that is substantially identical or similar in both upper and lower portions of the semiconductor package. Thus, the semiconductor package may have substantially identical or similar thermal expansion coefficient at its upper and lower portions, and thus an occurrence of warpage caused by temperature variation may be reduced or eliminated.

According to an exemplary embodiment of the present inventive concept, a second substrate may substantially cover a top surface of a semiconductor package. The second substrate may have a stiffness and/or strength (e.g., a resistance to breaking due to mechanical stress) greater than an adhesive layer and a mold layer. Thus, when the semiconductor package experiences a bending force, the second substrate may firmly support the semiconductor package, and may reduce or eliminate and occurrence of warpage in the semiconductor package.

While the inventive concept has been particularly shown and described with reference to exemplary embodiments thereof, it will be understood by those of ordinary skill in the art that various changes in form and detail may be made therein without departing from the spirit and scope of the inventive concept.

What is claimed is:
1. A semiconductor package, comprising:
a first substrate;
a first semiconductor chip positioned above the first substrate;
a second semiconductor chip positioned above a top surface of the first semiconductor chip;
an adhesive layer between the first semiconductor chip and the second semiconductor chip;
a second substrate disposed on the second semiconductor chip, wherein the second substrate substantially covers a top surface of the second semiconductor chip; and a mold layer disposed between the first substrate and the second substrate,
wherein the top surface of the second semiconductor chip is substantially aligned with a top surface of the mold layer along a direction parallel to the top surface of the second semiconductor chip.

2. The semiconductor package of claim 1, wherein the first semiconductor chip has substantially a same thickness as a thickness of the second semiconductor chip.

3. The semiconductor package of claim 1, wherein
the first semiconductor chip comprises a through electrode penetrating the first semiconductor chip,
the first semiconductor chip includes an active surface facing the first substrate, and
the second semiconductor chip includes an active surface facing the first semiconductor chip.

4. The semiconductor package of claim 1, wherein the first semiconductor chip includes a plurality of first semiconductor chips stacked above the first substrate.

5. The semiconductor package of claim 4, wherein the adhesive layer is further disposed between adjacent first semiconductor chips of the plurality of first semiconductor chips.

6. The semiconductor package of claim 1, wherein the adhesive layer has a width greater than widths of the first and second semiconductor chips.

7. The semiconductor package of claim 1, further comprising bumps between the first semiconductor chip and the second semiconductor chip,
wherein the bumps electrically connect the second semiconductor chip to the first semiconductor chip.

8. The semiconductor package of claim 1, wherein the first substrate comprises:
a silicon nitride layer on a bottom surface of the first substrate; and
external interconnect terminals on the bottom surface of the first substrate, wherein the external interconnect terminals are electrically connected to the first semiconductor chip.

9. The semiconductor package of claim 1, wherein the first substrate comprises a base semiconductor chip including a through electrode penetrating the base semiconductor chip, and
wherein the first semiconductor chip is electrically connected to the base semiconductor chip.

10. A method of fabricating a semiconductor package, the method comprising:
mounting chip stacks on a top surface of a first substrate, each of the chip stacks including a plurality of stacked semiconductor chips and an adhesive layer between the semiconductor chips;
forming a mold layer on the top surface of the first substrate;
removing a portion of the mold layer and portions of topmost chips of each of the chip stacks; and
forming a second substrate on the topmost chips of each of the chip stacks and the mold layer,
wherein each of the stacked semiconductor chips has substantially a same thickness after the portions of the topmost chips of each of the chip stacks is removed.

11. The method of claim 10, wherein top surfaces of each of the topmost chips are substantially aligned with a top surface of the mold layer along a direction parallel to the top surface of the mold layer after the portions of the topmost chips of each of the chip stacks is removed.

12. The method of claim 10, wherein the portion of the mold layer and the portions of topmost chips are removed by a grinding process.

13. The method of claim 10, wherein the adhesive layer has a width greater than widths of the semiconductor chips.

14. A semiconductor package, comprising:
a first substrate;
a plurality of semiconductor chips stacked above the first substrate, wherein each of the semiconductor chips of the plurality of semiconductor chips have a same thickness as each other;
an adhesive layer comprising an adhesive material, wherein the adhesive layer is formed between each of adjacent semiconductor chips of the plurality of semiconductor chips, wherein the adhesive layer is wider than widths of the plurality of stacked semiconductor chips, and wherein a first amount of the adhesive material adjacent to an uppermost semiconductor chip of the plurality of semiconductor chips is substantially the same as a second amount of the adhesive material adjacent to a lowermost semiconductor chip of the plurality of semiconductor chips; and
a mold layer formed on side surfaces of the adhesive layer,
wherein an upper surface of the uppermost semiconductor chip of the plurality of semiconductor chips is substantially aligned with an upper surface of the mold layer.

15. The semiconductor package of claim 14, wherein a first coefficient of thermal expansion in the adhesive material adjacent to the uppermost semiconductor chip of the plurality of semiconductor chips is substantially the same as a second coefficient of thermal expansion in the adhesive material adjacent to the lowermost semiconductor chip of the plurality of semiconductor chips.

16. The semiconductor package of claim 15, further comprising a second substrate disposed on the upper surface of the uppermost semiconductor chip of the plurality of semiconductor chips and the upper surface of the mold layer.

17. The semiconductor package of claim 16, wherein the second substrate has a resistance to breakage in response to mechanical stress greater than a resistance to breakage in response to mechanical stress of the adhesive layer and the mold layer.

* * * * *